(12) United States Patent
Hwang et al.

(10) Patent No.: US 9,048,135 B2
(45) Date of Patent: Jun. 2, 2015

(54) COPPER PILLAR BUMP WITH COBALT-CONTAINING SIDEWALL PROTECTION

(75) Inventors: Chien Ling Hwang, Hsinchu (TW); Zheng-Yi Lim, Hsinchu (TW); Chung-Shi Liu, Shin-Chu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 830 days.

(21) Appl. No.: 13/028,838

(22) Filed: Feb. 16, 2011

(65) Prior Publication Data

US 2012/0091577 A1 Apr. 19, 2012

Related U.S. Application Data

(60) Provisional application No. 61/394,038, filed on Oct. 18, 2010.

(51) Int. Cl.
*H01L 23/488* (2006.01)
*H01L 21/441* (2006.01)
*H01L 23/00* (2006.01)

(52) U.S. Cl.
CPC .................. *H01L 24/11* (2013.01); *H01L 24/03* (2013.01); *H01L 24/05* (2013.01); *H01L 24/13* (2013.01); *H01L 24/16* (2013.01); *H01L 24/81* (2013.01); *H01L 2224/0345* (2013.01); *H01L 2224/03831* (2013.01); *H01L 2224/0401* (2013.01); *H01L 2224/05144* (2013.01); *H01L 2224/05666* (2013.01); *H01L 2224/1145* (2013.01); *H01L 2224/11452* (2013.01); *H01L 2224/11462* (2013.01); *H01L 2224/11464* (2013.01); *H01L 2224/11622* (2013.01); *H01L 2224/11823* (2013.01); *H01L 2224/11825* (2013.01); *H01L 2224/11849* (2013.01); *H01L 2224/13083* (2013.01); *H01L 2224/13111* (2013.01); *H01L 2224/13139* (2013.01);

(Continued)

(58) Field of Classification Search
CPC ...... H01L 23/488; H01L 21/441; H01L 21/60
USPC .............. 257/737, E23.07, E21.477; 438/614
See application file for complete search history.

(56) References Cited

U.S. PATENT DOCUMENTS 7,276,801 B2 10/2007 Dubin et al.
7,700,476 B2 * 4/2010 Suh et al. ...................... 438/615

(Continued)

FOREIGN PATENT DOCUMENTS

| CN | 101075595 | 11/2007 |
| CN | 101536173 | 9/2009 |
| TW | 200924090 | 6/2009 |

OTHER PUBLICATIONS

Office Action dated Nov. 20, 2013 from corresponding application No. TW 100120497.

*Primary Examiner* — Walter H Swanson
(74) *Attorney, Agent, or Firm* — Lowe Hauptman & Ham, LLP (57) ABSTRACT

An integrated circuit device includes a Cu pillar and a solder layer overlying the Cu pillar. A Co-containing metallization layer is formed to cover the Cu pillar and the solder layer, and then a thermally reflow process is performed to form a solder bump and drive the Co element into the solder bump. Next, an oxidation process is performed to form a cobalt oxide layer on the sidewall surface of the Cu pillar.

21 Claims, 5 Drawing Sheets

(52) U.S. Cl.
CPC ............ H01L 2224/13144 (2013.01); H01L 2224/13147 (2013.01); H01L 2224/13155 (2013.01); H01L 2224/13164 (2013.01); H01L 2224/1357 (2013.01); H01L 2224/13582 (2013.01); H01L 2224/13583 (2013.01); H01L 2224/13657 (2013.01); H01L 2224/16145 (2013.01); H01L 2224/16227 (2013.01); H01L 2224/81193 (2013.01); H01L 2224/81447 (2013.01); H01L 2224/81815 (2013.01); H01L 2225/06513 (2013.01); H01L 2924/01012 (2013.01); H01L 2924/01013 (2013.01); H01L 2924/01029 (2013.01); H01L 2924/0103 (2013.01); H01L 2924/01038 (2013.01); H01L 2924/01047 (2013.01); H01L 2924/01049 (2013.01); H01L 2924/01051 (2013.01); H01L 2924/01073 (2013.01); H01L 2924/01079 (2013.01); H01L 2924/01082 (2013.01); H01L 2924/01006 (2013.01); H01L 2924/01019 (2013.01); H01L 2924/01023 (2013.01); H01L 2924/01024 (2013.01); H01L 2924/01033 (2013.01); H01L 2924/0104 (2013.01); H01L 2924/01075 (2013.01); H01L 2924/01078 (2013.01); H01L 2924/01322 (2013.01); H01L 2924/014 (2013.01); H01L 2924/01327 (2013.01); H01L 2924/13091 (2013.01); H01L 2224/13565 (2013.01); H01L 2224/16225 (2013.01); H01L 23/562 (2013.01); H01L 2224/13157 (2013.01); H01L 2924/01027 (2013.01); H01L 2924/01028 (2013.01); H01L 2924/0539 (2013.01); H01L 2924/20102 (2013.01); H01L 2924/2075 (2013.01); H01L 2924/20751 (2013.01); H01L 2924/1306 (2013.01)

(56) References Cited

U.S. PATENT DOCUMENTS

| | | | |
|---|---|---|---|
| 2003/0119300 A1* | 6/2003 | Chiu et al. | 438/615 |
| 2004/0094842 A1* | 5/2004 | Jimarez et al. | 257/772 |
| 2008/0003803 A1* | 1/2008 | Tsao et al. | 438/613 |
| 2008/0122078 A1* | 5/2008 | He et al. | 257/737 |
| 2009/0149016 A1 | 6/2009 | Park et al. | |
| 2010/0055846 A1* | 3/2010 | Lii et al. | 438/124 |
| 2010/0171220 A1* | 7/2010 | Huang | 257/751 |

* cited by examiner

COPPER PILLAR BUMP WITH COBALT-CONTAINING SIDEWALL PROTECTION

CROSS-REFERENCE TO RELATED APPLICATIONS

The present application claims priority of U.S. Provisional Patent Application Ser. No. 61/394,038, filed on Oct. 18, 2010, which is incorporated herein by reference in its entirety. The present application is related to co-pending U.S. Ser. No. 12/843,760 filed on Jul. 26, 2010, which is expressly incorporated by reference herein in their entirety.

TECHNICAL FIELD

This disclosure relates to integrated circuit fabrication and, more particularly, to copper pillar bump structures in integrated circuit devices.

BACKGROUND

Flip-chip packaging utilizes bumps to establish electrical contact between a chip's Input/Output (I/O) pads and the substrate or lead frame of the package. Structurally, a bump structure contains a bump and a so-called under bump metallurgy (UBM) located between the bump and an I/O pad. A UBM generally contains an adhesion layer, a barrier layer and a wetting layer, arranged in this order on the I/O pad. The bumps themselves, based on the material used, are classified as solder bumps, gold bumps, copper (Cu) pillar bumps and bumps with mixed metals. Recently, copper interconnect post technology is proposed. Instead of using solder bump, the electronic component is connected to a substrate by means of copper post. Compared with solder bump technology, the copper pillar bump technology achieves finer pitch with minimum probability of bump bridging, reduces the capacitance load for the circuits and allows the electronic component to perform at higher frequencies. A solder alloy is still necessary for capping the bump structure and joining electronic components as well.

Cu pillar bump flip-chip assembly has the following advantages: (1) better thermal/electric performance, (2) higher current carrying capacity, (3) better resistance to electro-migration, thus longer bump life, (4) minimizing molding voids—more consistence gaps between Cu pillar bumps. Also, a lower cost substrate is possible by using Cu pillar controlled solder spreading, eliminating lead-free teardrop design. Current process employs a photoresist layer with an opening, and forms a Cu pillar capped with a metal layer cap within the opening of the photoresist layer. However, the formation of the metal layer cap often leads to defects before and/or after the photoresist stripping process. In addition, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low dielectric constant (low-k) dielectric layers or to the solder used to bond the copper pillars to the substrate.

A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, thickness limitations in the immersion Sn layer, adhesion between Sn and underfill, and issues of solder wetting onto sidewalls and solder under-cooling effect, which is a challenge for fine pitch package technology in new generation chips.

DETAILED DESCRIPTION

This disclosure provides embodiments of processes of forming sidewall protection for Cu pillar bump technology. As employed throughout this disclosure, the term "Cu pillar bump" refers to a bump structure comprising a conductive pillar (a post or a standoff) including copper or copper alloys. The Cu pillar bump may be applied directly on an electrical pad, a redistribution layer on a semiconductor chip for a flip chip assembly, or other similar applications. In the following description, numerous specific details are set forth to provide a thorough understanding of the disclosure. However, one having ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A~1G are cross-sectional views of a portion of a semiconductor device at various stages in a Cu pillar bump manufacturing process in accordance with an exemplary embodiment.

Figure 1A:
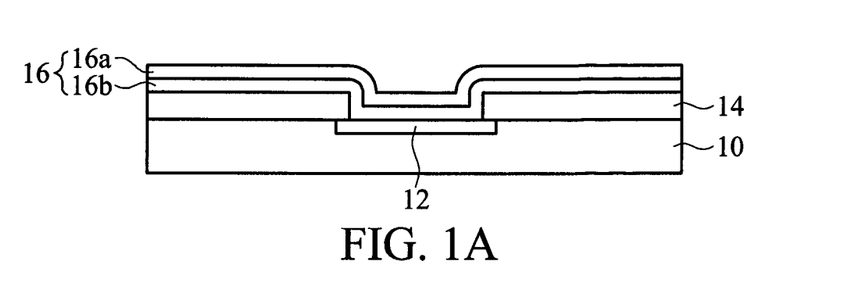
FIG. 1A~1G are cross-sectional views depicting an exemplary embodiment of forming a Cu pillar bump structure.

With reference to FIG. 1A, an example of a substrate 10 used for bump fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and/or group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and/or other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and/or other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will be able to perform the formation of the metallization layers using applicable processes, and thus details for forming the metallization layer are omitted. As shown in FIG. 1A, a conductive region 12 is a metallization layer formed in a top-level inter-layer dielectric layer, which is a portion of conductive routs and has an exposed surface treated by a planarization process, such as chemical mechanical polishing (CMP), if necessary. Suitable materials for the conductive region may include, but are not limited to, for example copper (Cu), aluminum (Al), AlCu, copper alloy, or other conductive materials. The contact region 12 can be a metal pad region or a redistribution line region used in the bonding process to connect the integrated circuits in the respective chip to external features.

FIG. 1A also depicts a passivation layer 14 formed on the substrate 10 and patterned to form an opening exposing a portion of the contact region 12 for allowing subsequent bump formation. In at least one embodiment, the passivation layer 14 is formed of a non-organic material such as un-doped silicate glass (USG), silicon nitride, silicon oxynitride, silicon oxide, or combinations thereof. In another embodiment, the passivation layer 14 is formed of a polymer layer, such as an epoxy, polyimide, benzocyclobutene (BCB), polybenzoxazole (PBO), or the like, although other relatively soft, often organic, dielectric materials can also be used.

FIG. 1A further shows the formation of an under-bump-metallurgy (UBM) layer 16. In some embodiments, the UBM layer 16 includes a first UBM layer 16a and a second UBM layer 16b formed over the substrate 10. For example, the UBM layer 16 is formed on the exposed portion of the contact region 12, and extends over a portion of the passivation layer 14. The first UBM layer 16a, also referred to as a diffusion barrier layer or a glue layer, is formed of titanium, tantalum, titanium nitride, tantalum nitride, or the like by physical vapor deposition (PVD) or sputtering. The first UBM layer 16a is deposited to a thickness ranging from about 500 to 2000 Angstroms and, in some embodiments for example, to a thickness of about 1000 Angstroms. The second UBM layer 16b is a copper seed layer formed on the first UBM layer 16a by physical vapor deposition (PVD) or sputtering. The second UBM layer 16b may be formed of copper alloys that include silver, chromium, nickel, tin, gold, or combinations thereof. The second UBM layer 16b is deposited to a thickness ranging from about 500 to 10000 Angstroms and, in some embodiments for example, to a thickness of about 5000 Angstroms. In at least one embodiment, the UBM layer 16 includes a first UBM layer 16a formed of Ti and a second UBM layer 16b formed of Cu.

Figure 1B:
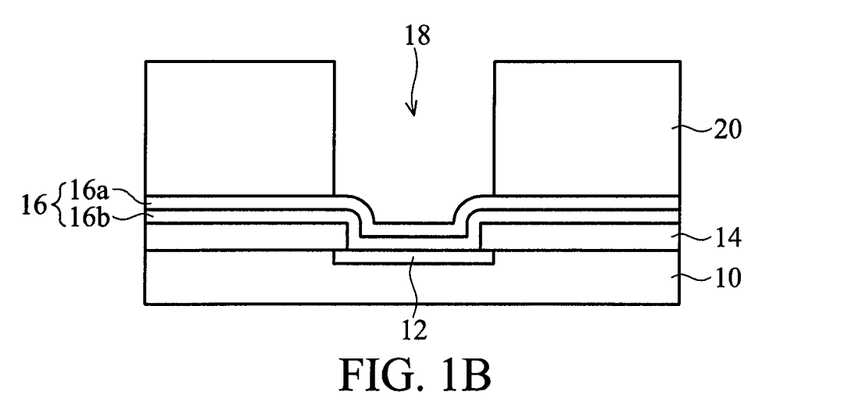

Next, in FIG. 1B, a mask layer 20 is provided on the first UBM layer 16A and patterned with an opening 18 exposing a portion of the first UBM layer 16a for bump formation. The mask layer 20 is a dry film or a photoresist film through the steps of coating, curing, descum and/or the like, followed by lithography technology and etching processes such as a dry etch and/or a wet etch process.

Figure 1C:
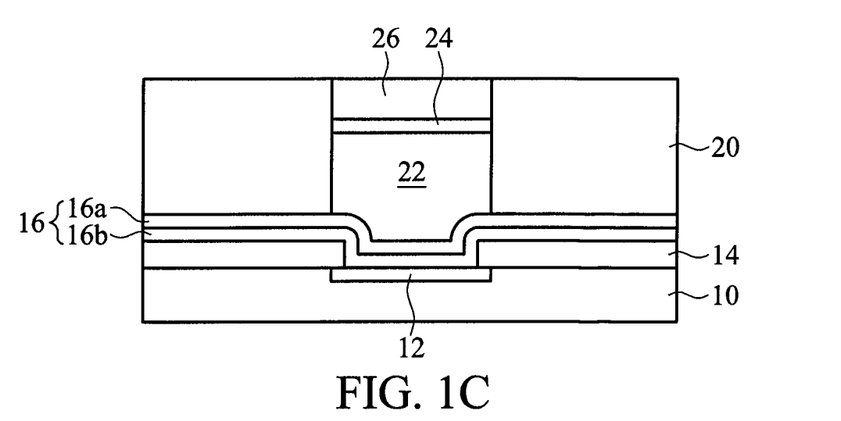

The opening 18 is then partially filled with a conductive material with solder wettability. With reference to FIG. 1C, a copper (Cu) layer 22 is formed in the opening 18 to contact the underlying second UBM layer 16b. The Cu layer 22 is intended to include substantially a layer including pure elemental copper, copper containing unavoidable impurities, and/or copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and/or commonly used chemical vapor deposition (CVD) methods. For example, electro-chemical plating (ECP) is carried out to form the Cu layer 22. In an exemplary embodiment, the thickness of the Cu layer 22 is greater than 30 µm. In another exemplary embodiment, the thickness of the Cu layer 22 is greater than 40 µm. For example, the Cu layer 22 is of about 40~50 µm thickness, or about 40~70 µm thickness, although the thickness may be greater or smaller. The Cu layer 22 is referred to as a Cu pillar 22 hereinafter.

Next, a metal cap layer 24 is formed on the top surface of the Cu pillar 22. The metal cap layer 24 could act as a barrier layer to prevent copper in the Cu pillar 22 to diffuse into bonding material, such as solder alloy, that is used to bond the substrate 10 to external features. The prevention of copper diffusion increases the reliability and bonding strength of the package. The metal cap layer 24 is a metallization layer which may include nickel, tin, tin-lead (SnPb), gold (Au), silver, palladium (Pd), In, nickel-palladium-gold (NiPdAu), nickel-gold (NiAu), other similar materials, or alloys. The metal cap layer 24 is a multi-layered structure or a single-layered structure. In at least one embodiment, the metal cap layer 24 has a thickness about 1~5 µm. A solder layer 26 is then formed on the metal cap layer 24 within the opening 18 of the mask layer 20. The solder layer 26 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. In at least one embodiment, the solder layer 26 is formed of a lead-free solder material layer.

Figure 1D:
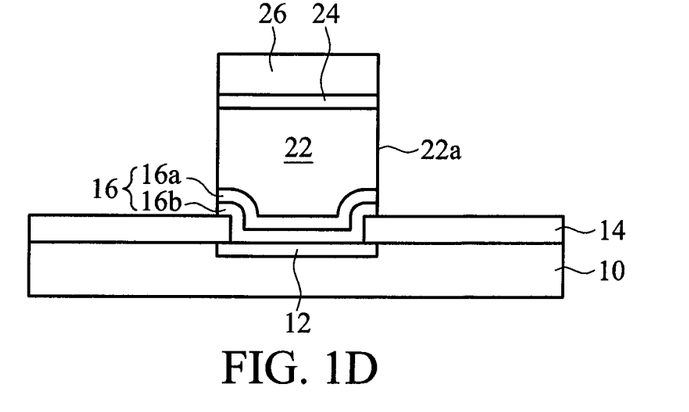

Referring to FIG. 1D, the mask layer 20 is removed to expose portions of the UBM layer 16. The resulting structure includes the Cu pillar 22, the metal cap layer 24 and the solder layer 26, and the sidewall surfaces 22a of the Cu pillar 22 are also exposed. In the case the mask layer 20 is a dry film, it may be removed using an alkaline solution. Thereafter, the exposed portions of the second UBM layer 16b and the first UBM layer 16a are etched back using the resulting structure (including layers 22, 24 and 26) as a mask by a wet and/or dry etching process, depending on the metallurgy of the UBM material.

Figure 1E:
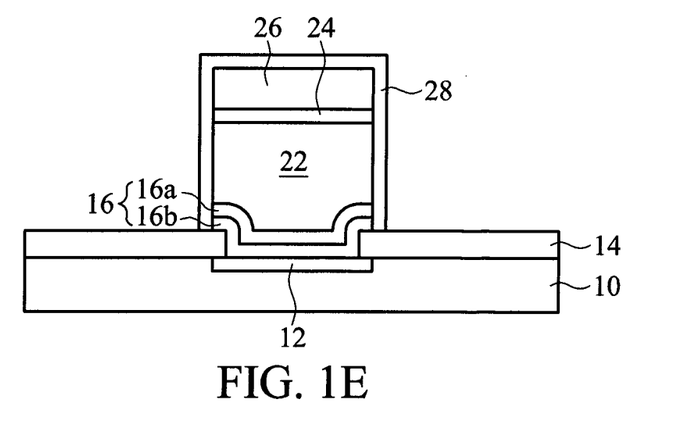

In order to protect the exposed sidewall surfaces 22a of the Cu pillar 22, the process proceeds to the formation of a sidewall protection on the Cu pillar 22. As shown in FIG. 1E, in one embodiment, a metallization layer 28 is formed on the exposed sidewall surface 22a of the Cu pillar 22. In some embodiments, the metallization layer 28 extends to cover the exposed surfaces of the metal cap layer 24 and the solder layer 26. The metallization layer 28 includes cobalt (Co) or Co alloy (such as CoWBP or CoWP). Cobalt-based capping is employed to inhibit Cu diffusion and migration. By electroless plating process or immersion plating process, the metallization layer 28 is selectively formed on the exposed surfaces of the UBM layer 16, the Cu pillar 22, the metal cap layer 24 and the solder layer 26, but not on the passivation layer 14. By using the electroless plating, the thickness of the metallization layer 28 may be accurately controlled. In some embodiments, the metallization layer 28 has a thickness about 0.1~10 μm. The metallization layer 28 may be a single-layered structure, a dual-layered structure or a triple-layered structure.

Figure 1F:
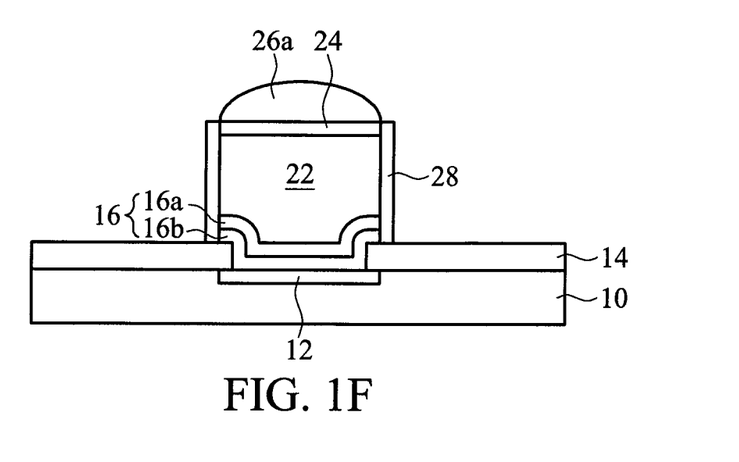

Referring to FIG. 1F, a thermally reflowing process is performed to melt the solder layer 26 to form a hemisphere-shaped solder bump 26a, for example, either through the wafer heating or a rapid thermal processing (RTP). The Co elements in the metallization layer 28 are mixed into the resulting solder bump 26a. After the re-flow, in some embodiments, an additional anneal may be optionally performed at a temperature lower than the melting temperature of solder bump 26a to further diffuse the Co elements in solder bump 26a. In the resulting solder bump 26a, Co elements may have an atomic percentage less than about 0.7 percent, or less than about 0.1 percent, or even lower than about 0.01 percent. Due to the addition of cobalt elements, the formation of $SnAgCo_x$ intermetallic compound (IMC) is existed in the solder bump 26a to suppress the SnAg IMC. Thus, the under-cooling effect of the solder bump 26a may be at least reduced, and the solder bump 26a may be solidified more uniformly. It is observed that the under-cooling temperature of the Co-doped solder bump can be lowered down to about 7° C.~30° C.

Next, an oxidation process is performed to form the metallization layer 28 as a metal oxide layer 30 in order to eliminate Cu pillar sidewall wetting issues. In at least one embodiment, the metal oxide layer 30 is a cobalt oxide ($CoO_x$) layer. This completes a bump structure 32 including the Cu pillar 22, the metal cap layer 24, the solder bump 26a and the metal oxide layer 30. This disclosure provides a method of capping the sidewall surface of the Cu pillar 22 by an electroless Co deposition process after removing the mask layer 20 and then oxidizing the metallization layer 28 after thermally reflowing the solder layer 26. In addition to serve as a sidewall protection, the Co elements can be dosed and distributed into the solder bump 26a to change the properties of the solder material, and the metal oxidation process can prevent Cu pillar sidewall from solder wetting. The non-wetting effect is beneficial for bump-on-trace (BOT) packaging technology. Compared with conventional immersion Sn process, the electroless Co deposition method can allow a better control of the thickness of the sidewall protection layer to achieve a thinner sidewall protection layer, and thus the process cost is decreased.

Figure 1G:
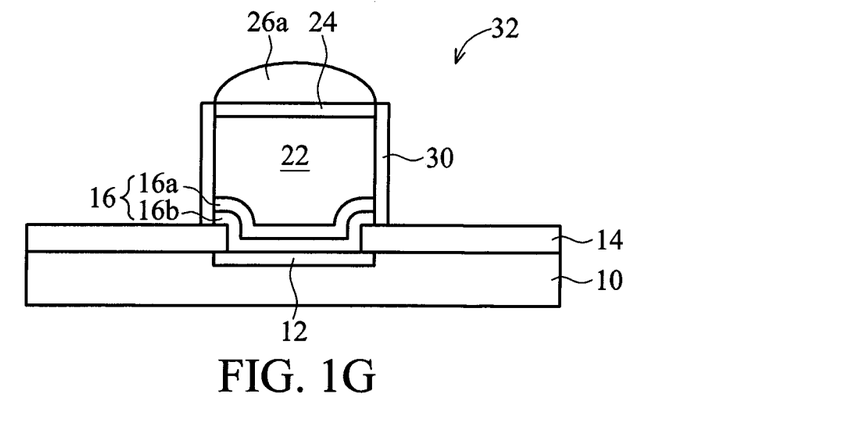
Figure 2:
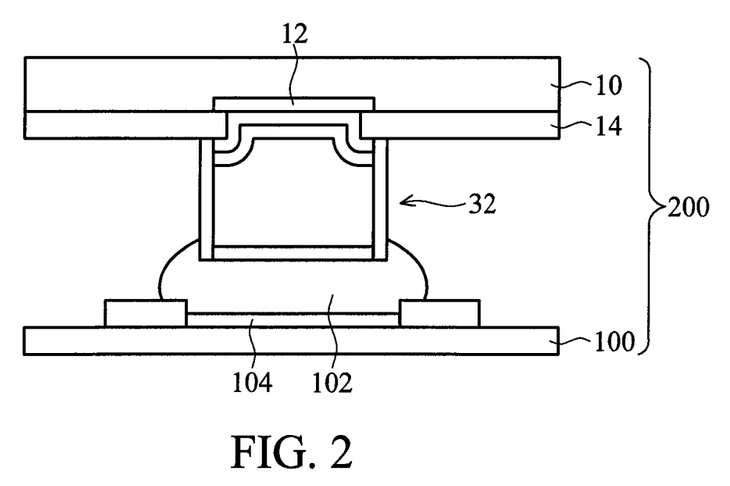
FIG. 2 is a cross-sectional view of a packaging assembly in accordance with an exemplary embodiment.

The substrate 10 is then sawed and packaged onto a package substrate, or another die, with solder balls or Cu bumps mounted on a pad on the package substrate or the other die. FIG. 2 is a cross-sectional diagram depicting an exemplary embodiment of a flip-chip assembly. The structure shown in FIG. 1G is flipped upside down and attached to another substrate 100 at the bottom of FIG. 2. The substrate 100 may be a package substrate, board (e.g., a print circuit board (PCB)), or other suitable substrate. The bump structure 32 is coupled to the substrate 100 through various conductive attachment points, for example, a joint solder layer 102 on contact pads and/or conductive traces 104, to form a joint structure, which couples the two substrates 10 and 100. The joint solder layer 102 may be a eutectic solder material including alloys of tin, lead, silver, copper, nickel, bismuth, or combinations thereof. In some embodiments, since the joint solder layer 102 is formed by jointing the solder bump 26a and a pre-solder layer of the substrate 100. The joint solder layer 102 includes Co elements. An exemplary coupling process includes a flux application, chip placement, reflowing of melting solder joints, and/or cleaning of flux residue. The integrated circuit substrate 10, the joint solder layer 102, and the other substrate 100 may be referred to as a packaging assembly 200, or in the present embodiment, a flip-chip packaging assembly. In at least one embodiment, the bump structure 32 and the conductive trace 104 overlap and form a bump-on-trace (BOT) interconnect.

Figure 3:
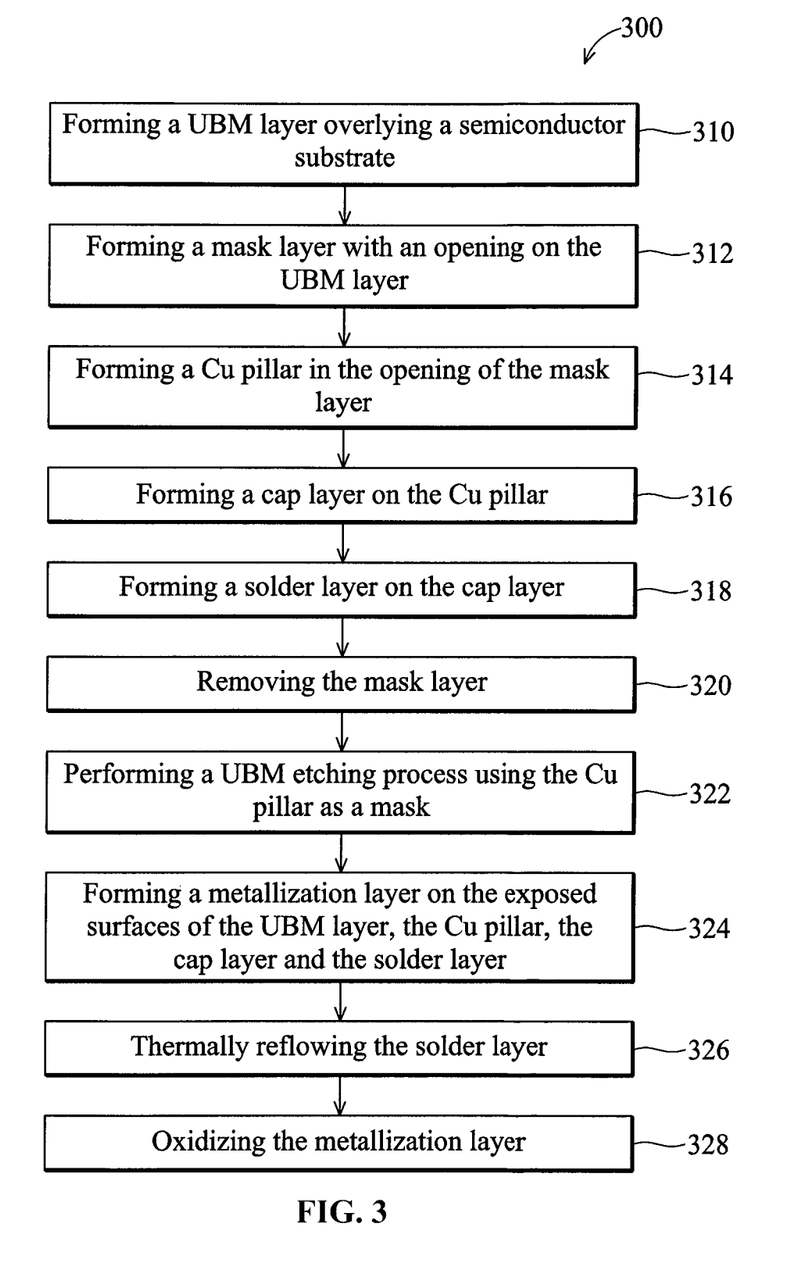
FIG. 3 illustrates a flowchart of a method for fabricating a Cu pillar bump structure according to various aspects of the present disclosure.

Referring now to FIG. 3, illustrated is a flowchart of a method 300 used to form a bump structure according to one embodiment of the current disclosure. The method 300 may be used to fabricate the structure set forth in the above figures such as the bump structure 32. It is understood that additional steps may be performed before, during, and/or after the method 300, and some of the steps described below can be replaced or eliminated in various embodiments of the method.

The method 300 beings at step 310 where a UBM layer is formed overlying a semiconductor substrate. In at least one embodiment, the semiconductor substrate includes a conductive region and a passivation layer with an opening exposing a portion of the conductive region. The UBM layer is electrically connected to the conductive region through the opening of the passivation layer. A mask layer is formed on the UBM layer at step 320, in which the mask layer is patterned with an opening exposing a portion of the UBM layer. In a next step 314, a Cu pillar is formed in the opening of the mask layer to electrically connect the underlying UBM layer. Then a metal cap layer is formed on the Cu pillar at step 316 followed by the formation of a solder layer on the metal cap layer at step 318. Next, the mask layer is removed at step 320 and then a UBM process is performed at step 322 to remove the exposed portions of the UBM layer using the Cu pillar as the mask. The method 300 proceeds to step 324 where a metallization layer is formed on the exposed surfaces of the UBM layer, the Cu pillar, the metal cap layer and the solder layer. In one embodiment, the metallization layer includes at least one of a Co layer or a Co alloy layer formed by electroless deposition. The method 300 then proceeds to step 326 where a thermally reflowing process is performed on the solder layer. The solder layer is reflown to become a hemisphere-shaped solder bump in which Co elements are dosed and distributed. In a next step 328, an oxidation process is performed on the metallization layer, to form a metal oxide layer on the sidewall surfaces of the Cu pillar and/or the metal cap layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:
1. An integrated circuit device, comprising:
 a semiconductor substrate;
 an under-bump-metallurgy (UBM) layer overlying the semiconductor substrate;

a conductive pillar on the UBM layer, the conductive pillar having a sidewall surface, the sidewall surface having a first length; and a cobalt oxide layer having a cobalt oxide layer surface directly contacting the sidewall surface of the conductive pillar, the cobalt oxide layer surface having a second length greater than the first length, wherein a bottom surface of the conductive pillar is free of the cobalt oxide layer.

2. The integrated circuit device of claim 1, further comprising a solder layer overlying the conductive pillar, wherein the solder layer comprises a cobalt (Co) element.

3. The integrated circuit device of claim 2, wherein the solder layer comprises a lead-free solder material layer.

4. The integrated circuit device of claim 2, further comprising a metal cap layer between the conductive pillar and the solder layer.

5. The integrated circuit device of claim 4, wherein the cobalt oxide layer extends to cover a sidewall surface of the metal cap layer.

6. The integrated circuit device of claim 4, wherein the metal cap layer comprises nickel.

7. The integrated circuit device of claim 1, wherein the conductive pillar is a copper pillar.

8. The integrated circuit device of claim 1, further comprising:

a metal cap layer over the conductive pillar, wherein the conductive pillar has a top surface, and the cobalt oxide layer surface extends beyond the top surface to cover a sidewall surface of the metal cap layer.

9. A packaging assembly, comprising:

a first substrate comprising a bump structure, the bump structure comprising:

an under bump metallurgy (UBM) layer over the first substrate;

a metal pillar over the UBM layer, the metal pillar having a sidewall surface and a top surface, wherein the top surface is orthogonal to the sidewall surface; and a cobalt oxide layer directly contacting the sidewall surface of the metal pillar, wherein a bottom surface of the metal pillar is free of the cobalt oxide layer;

a second substrate attached to the first substrate; and a joint solder layer between the second substrate and the bump structure of the first substrate.

10. The packaging assembly of claim 9, wherein the joint solder layer comprises a cobalt (Co) element.

11. The packaging assembly of claim 9, wherein the bump structure comprises a metal cap layer between the conductive pillar and the joint solder layer.

12. The packaging assembly of claim 11, wherein the cobalt oxide layer extends to cover the sidewall surface of the metal cap layer.

13. The packaging assembly of claim 11, wherein the metal cap layer comprises nickel.

14. The packaging assembly of claim 9, wherein the metal pillar is a copper pillar.

15. The packaging assembly of claim 9, wherein the second substrate comprises a conductive trace which overlaps the bump structure to form a bump-on-trace interconnect.

16. A packaging assembly, comprising:

a first substrate comprising a bump structure;

a second substrate attached to the first substrate; and a joint solder layer between the second substrate and the bump structure of the first substrate;

wherein the bump structure comprises:

an under bump metallurgy (UBM) layer over the first substrate, the UBM layer comprising a diffusion barrier layer having a thickness ranging from 500 angstroms to 2000 angstroms;

a conductive pillar over the UBM layer, the conductive pillar having a sidewall surface and a top surface, wherein the top surface is orthogonal to the sidewall surface; and a cobalt oxide layer directly contacting the sidewall surface of the conductive pillar, wherein a bottom surface of the conductive pillar is free of the cobalt oxide layer.

17. The packaging assembly of claim 16, wherein the bump structure further comprises a cap layer over the conductive pillar, and the cobalt oxide layer is on a sidewall surface of the cap layer.

18. The packaging assembly of claim 16, wherein the UBM layer comprises a seed layer having a thickness ranging from 500 angstroms to 10,000 angstroms.

19. An integrated circuit device, comprising:

a semiconductor substrate;

an under-bump-metallurgy (UBM) layer overlying the semiconductor substrate;

a conductive pillar on the UBM layer, the conductive pillar having a sidewall surface and a top surface, wherein the top surface is orthogonal to the sidewall surface;

a cobalt oxide layer on the sidewall surface of the conductive pillar;

a solder layer overlying the conductive pillar, the solder layer comprising a cobalt (Co) element; and a metal cap layer between the conductive pillar and the solder layer, wherein a bottom surface of the conductive pillar is free of the cobalt oxide layer.

20. The integrated circuit of claim 19, wherein the top surface of the conductive pillar has a first width, the metal cap layer has a metal cap layer surface in contact with the top surface of the conductive pillar, the metal cap layer surface has a second width equal to the first width, the sidewall surface of the conductive pillar has a first length, the cobalt oxide layer has a cobalt oxide layer surface in contact with the sidewall surface of the conductive pillar, the cobalt oxide layer surface has a second length greater than the first length, and the cobalt oxide layer surface is in contact with a surface of the metal cap layer different from the metal cap layer surface.

21. A packaging assembly, comprising:

a first substrate comprising a bump structure, the bump structure comprising an under bump metallurgy (UBM) layer over the first substrate;

a metal pillar over the UBM layer, the metal pillar having a sidewall surface and a top surface, wherein the top surface is orthogonal to the sidewall surface; and a cobalt oxide layer on the sidewall surface of the metal pillar;

a second substrate attached to the first substrate; and a joint solder layer between the second substrate and the bump structure of the first substrate, wherein the bump structure further comprises a metal cap layer between the conductive pillar and the joint solder layer, and a bottom surface of the conductive pillar is free of the cobalt oxide layer.

* * * * *